United States Patent
Hofer et al.

(10) Patent No.: US 12,071,339 B2
(45) Date of Patent: Aug. 27, 2024

(54) MICRO-ACOUSTIC WAFER-LEVEL PACKAGE AND METHOD OF MANUFACTURE

(71) Applicant: RF360 SINGAPORE PTE. LTD., Republic Plaza (SG)

(72) Inventors: Manuel Hofer, Munich (DE); Rodrigo Pacher Fernandes, Munich (DE); Stefan Leopold Hatzl, Munich (DE); Josef Ehgartner, Munich (DE); Peter Bainschab, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 510 days.

(21) Appl. No.: 17/294,615

(22) PCT Filed: Dec. 13, 2019

(86) PCT No.: PCT/EP2019/085083
§ 371 (c)(1),
(2) Date: May 17, 2021

(87) PCT Pub. No.: WO2020/126907
PCT Pub. Date: Jun. 25, 2020

(65) Prior Publication Data
US 2021/0395076 A1     Dec. 23, 2021

(30) Foreign Application Priority Data
Dec. 18, 2018   (DE) .................... 10 2018 132 644.0

(51) Int. Cl.
*B81B 7/00*    (2006.01)
*B81C 1/00*    (2006.01)
(Continued)

(52) U.S. Cl.
CPC ........ *B81B 7/0051* (2013.01); *B81C 1/00269* (2013.01); *H03H 3/007* (2013.01);
(Continued)

(58) Field of Classification Search
None
See application file for complete search history.

(56) References Cited

U.S. PATENT DOCUMENTS

| 6,661,084 B1 | 12/2003 | Peterson et al. |
| 7,109,635 B1 | 9/2006 | McClure et al. |

(Continued)

FOREIGN PATENT DOCUMENTS

| CN | 101261932 A | 9/2008 |
| CN | 101325184 A | 12/2008 |

(Continued)

OTHER PUBLICATIONS

International Search Report and Written Opinion—PCT/EP2019/085083—ISA/EPO—Mar. 6, 2020.

*Primary Examiner* — Michelle Mandala
(74) *Attorney, Agent, or Firm* — Polsinelli

(57) ABSTRACT

A wafer-level package for micro-acoustic devices and a method of manufacture is provided. The package comprises a base wafer with electric device structures. A frame structure is sitting on top of the base wafer enclosing particular device areas for the micro-acoustic devices. A cap wafer provided with a thin polymer coating is bonded to the frame structure to form a closed cavity over each device area and to enclose within the cavity the device structures arranged on the respective device area.

20 Claims, 3 Drawing Sheets

(51) Int. Cl.
*H03H 3/007* (2006.01)
*H03H 9/17* (2006.01)

(52) U.S. Cl.
CPC ..... *H03H 9/171* (2013.01); *B81B 2201/0271* (2013.01); *B81B 2207/053* (2013.01); *B81C 2203/0118* (2013.01); *B81C 2203/037* (2013.01)

(56) References Cited

U.S. PATENT DOCUMENTS

| | | | |
|---|---|---|---|
| 7,459,829 B2* | 12/2008 | Aoki | H03H 3/08 |
| | | | 333/195 |
| 8,709,868 B2 | 4/2014 | Bowles | |
| 10,958,240 B2* | 3/2021 | Fukushima | H03H 9/02984 |
| 2004/0145278 A1* | 7/2004 | Iwamoto | H03H 9/059 |
| | | | 310/348 |
| 2004/0232802 A1 | 11/2004 | Koshido | |
| 2006/0131998 A1* | 6/2006 | Aoki | H03H 3/08 |
| | | | 310/340 |
| 2010/0308455 A1 | 12/2010 | Kim et al. | |
| 2011/0006381 A1 | 1/2011 | Feiertag et al. | |
| 2015/0198493 A1 | 7/2015 | Kaelberer et al. | |

FOREIGN PATENT DOCUMENTS

| | | |
|---|---|---|
| CN | 102270609 A | 12/2011 |
| CN | 102786026 A | 11/2012 |
| CN | 103335751 A | 10/2013 |
| CN | 107265391 A | 10/2017 |
| DE | 102006005419 A1 | 8/2007 |

* cited by examiner

MICRO-ACOUSTIC WAFER-LEVEL PACKAGE AND METHOD OF MANUFACTURE

Micro-acoustic devices need a cavity for enclosing the acoustically active device structures therein. A preferred method of forming such a cavity is a wafer-level packaging process where a cap wafer is wafer-bonded to a base wafer that carries the functional device structures. A recess in the cap wafer or a spacer like a frame structure arranged between base wafer and cap wafer provide the required space for the cavity.

Wafer-bonding may comprise a high temperature step that is mandatory to successfully wafer bond both the same- or similar materials (i.e. $LiTaO_3$, $LiNbO_3$ which are both anisotropic materials) in a reliable and tight way. Due to the same thermal behavior no stress is produced after cooling.

When exposing two wafers out of different materials to a high temperature and mutually fixing the wafers the both wafers usually show different thermal expansion that cause mechanical stress in the wafer-bonded arrangement after cooling to room temperature. Moreover, piezoelectric materials are anisotropic and show a CTE that is different along two different crystal axes. Hence an isotropic cap wafer cannot be matched anisotropic base wafer in all directions.

To minimize the thermal mismatch the cap wafer material is chosen to provide an optimized CTE, normally a trade-off between a thermal matching along a first and a second crystal axis of the anisotropic base wafer. Further, a low temperature wafer-bonding process would be advantageous to successfully combine materials with different CTEs.

A currently used cap wafer material is glass. As glass has a lower CTE than $LiTaO_3$ or $LiNbO_3$ the CTE of normal glass has to be enhanced. To do so, heavy and larger ions (e.g. barium and the like) can be included into the glass material. However, other problems may arise from these large ions. They are prone to diffuse out of the glass material at the surface when exposed to extreme conditions. Within the small volume of the cavity of the package even small amounts of cations in the cavity atmosphere may impair the properties or reliability of the micro-acoustic device.

It is an object of the present invention to provide a wafer-level package that avoids the above mentioned problems that an air-tight and reliably bonded package is achieved that leaves over only little residual thermo-mechanical stress.

These and other objects are solved by a micro-acoustical wafer-level package according to claim 1. Advantageous features and embodiment as well as a method for producing such a package is given by further claims.

A micro-acoustic wafer-level package comprises a base wafer, a frame structure and a cap wafer stacked and mutually fixed one above another. Electric structures for micro-acoustic devices are arranged as an array on a top surface of the base wafer and each electric structure is assigned to a respective device area. The frame structure comprises a polymer, is sitting on and fixed to the top of the base wafer and encloses or surrounds each particular device area whereas the cap wafer is bonded to the frame structure.

By this sandwich like arrangement a closed cavity is formed over each device area. Inside the cavity the device structures are enclosed and a mechanically stable package is formed wherein the electric structures are enclosed and air-tightly sealed.

The micro-acoustic device is formed on or in a piezoelectric functional layer that represents or is at least part of the base wafer. The device is operated by the electric structures that are embodied as conductors, electrodes or micro-acoustic transducers. The cap wafer is a glass wafer and has a polymer coating on a bottom surface thereof. This enables an easy bonding of the cap wafer to the polymeric frame structure in a low temperature process.

The polymer frame structure reduces the thermomechanical stress that has built up during the sandwich forming process i.e. the bonding of the cap wafer to the frame structure. Moreover, during the low temperature bonding step only little stress can build up as the temperature difference is small.

Preferably the polymer coating is a thin homogeneous layer and consists of or comprises a UV-curable polymer. This means that no thermal step is required for curing. As the bonding step can be performed by curing the polymer coating while pressing it against the frame structure the bonding step can be performed at room temperature und does not require any rise of temperature such that the build-up bonding stress is substantially reduced.

According to an embodiment the glass material of the cap wafer comprises additional elements i.e. certain amount of ions, e.g. Ba, to provide a CTE that is matched to the CTE of the base wafer or close to the CTE along one or two crystal axes of the anisotropic piezoelectric material. The additional elements may be chosen from the first and second main group of the periodic system. The better the CTEs of base wafer and cap wafer are matched the smaller is the build-up stress after forming the package, even if a rise of temperature is required for the bonding step.

The proposed package solves the problem of how a glass wafer can be combined with an anisotropic material. Moreover, by the polymer coating a tight sealing of the bottom surface of the glass cap wafer inside the cavity is achieved that prevents any elements coming out of the glass through the sealed surface. An airtight DSSGP (Die Sized SAW Glass Package) is achieved.

According to an embodiment the electric structures comprise a SAW transducer formed on piezoelectric layer of the base wafer or on a piezoelectric wafer the base wafer consists of.

The piezoelectric layer may be a functional layer applied onto a carrier wafer. This allows to use thin piezoelectric layers for forming a thin film SAW device.

The base wafer may be a carrier wafer on a top surface of which a BAW resonator is formed. The frame structure may be applied to the carrier wafer. Each device area surrounded by the frame structure may comprise one or more BAW resonators that are circuited to form a filter circuit.

The base wafer may be a wafer of piezoelectric $LiTaO_3$ or $LiNbO_3$. Alternatively the base wafer may comprise a piezoelectric layer of $LiTaO_3$ or $LiNbO_3$.

A BAW resonator may comprise a functional layer of AlN or ZnO embedded between a bottom electrode and a top electrode. Between base wafer and bottom electrode an acoustic mirror like a Bragg mirror for example may be arranged.

The package can be formed on wafer-level and results in an arrangement of two wafers. In further process steps single micro-acoustic devices may be singulated from the wafers according to dicing steps that are well known in the art. The resulting single devices may comprise exact one cavity with electric structures on the enclosed device area comprising a piezoelectric material. Alternatively a singulated device may comprise more than one cavity.

A possible method of forming the described micro-acoustic wafer-level package comprising the following steps:

providing a base wafer with an array of device areas on a top surface thereof assigned to a respective microacoustic device each forming a frame structure on the top surface that encloses each particular device area with the respective electric structures providing a cap wafer having an CTE adapted to the CTE of the base wafer and being provided with a UV-curable polymer coating on an underside thereof wafer-bonding the cap wafer with the polymer coating to the frame structure and curing the polymer coating by exposing the arrangement to UV light.

The bonding may be supported by applying uni-axial pressure normal to the surface of one of the two wafers to be bonded together. The advantage is that the cap wafer of glass is transparent for UV light and allows irradiating the arrangement from the top through the glass for curing.

On the base wafer the device are preformed and need only be packaged and sealed. Sealing is automatically achieved by curing the polymer coating that bonds to the polymer frame structure. Using the thin layer of UV curable polymer, properties comparable to the actual packaging technology are achieved (i.e. mechanical die shear strength and chemical resistance). Additionally, the cured polymer on the inner surface of the package offers an increased mechanical strength of the package by coating possible micro-cracks in the glass of the cap wafer thereby precluding/minimizing subcritical crack growth.

In the following the invention is explained in more detail with regard to specific embodiments and the relating figures. The figures are schematic only and not drawn to scale. Hence, no absolute or relative dimensions can be taken from the figures.

FIG. 1 shows a cross sectional view of an arrangement of a base wafer and a cap wafer FIG. 2 shows the arrangement of FIG. 1 after bonding the base wafer and the cap wafer to form a wafer level package FIG. 3 shows in a cut-out of FIG. 2 how the two wafers are connected FIGS. 4 to 6 show in a cross sectional view different process steps of a half-cut dicing process that facilitates the later singulation of particular packaged devices FIG. 7 shows a perspective view of a singulated microacoustic device after packaging, further processing and singulation.

FIG. 1 shows an arrangement of a base wafer BW and a cap wafer CW in a cross sectional view. In this embodiment the base wafer BW is a piezoelectric wafer of $LiNbO_3$ or $LiTaO_3$. On the top surface of the base wafer metallic electric structures ES are provided comprising electrodes and transducers of a SAW device. A frame structure FS is formed on the top surface of the base wafer BW. This can be done by applying a photoresist to the entire top surface and lithographically structuring same. By this structuring step each device area DA on the base wafer BW that complies with the active chip area of the later device is completely surrounded by the frame structure FS. The frame structure may comprise separated frames for each device area $DA_1$, $DA_2$ as shown. It is also possible that the frame structure has broader width that is may separated in a later singulation process at the edge of the later device. Electric contact areas (not shown in the figure) of the electric device structures may extend under the frame structure to an area on the surface of the base wafer that is not enclosed by the frame structure FS. In a variant the electric contact areas are provided under the frame structure and need to be exposed in a later step.

The cap wafer CW is a glass wafer that has a thin polymer coating PC at its bottom side.

The polymer may be an UV-curable photoresist that is applied with a layer thickness of e.g. 1000 nm to 1500 nm, which ends up to a final intermediate layer thickness in the order of 100 nm to 500 nm after Waferbonding.

Then the cap wafer CW is attached to the frame structure FS with its bottom side. To make a tight connection the cap wafer is exposed to UV light from the top for a period of about 100 seconds or more. Thereby uniaxial pressure is applied normal to the surface of cap wafer or base wafer the compress the arrangement that a tight bonding is achieved.

FIG. 2 shows the arrangement at this step. Cavities CV are formed between base wafer BW and cap wafer CW over each device area DA by the frame structure FS forming the side walls thereof. In the cavities the electric structures are enclosed keeping a gap to the cap wafer. Dotted separation lines SL indicate the later edges along which the single devices can be separated from the large area wafer package. Chip area CA indicates the area of a single device/chip after a later singulation process.

Figure 1:
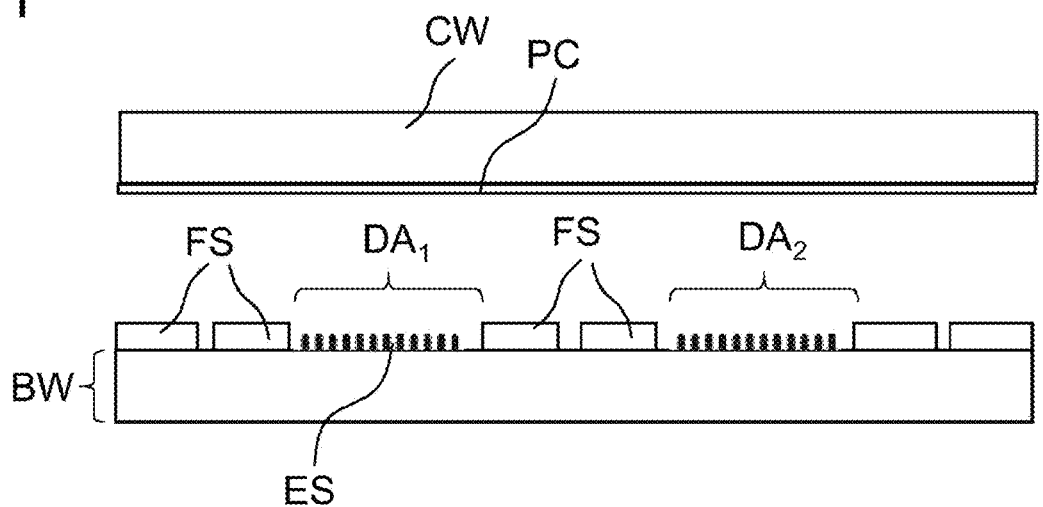
Figure 2:
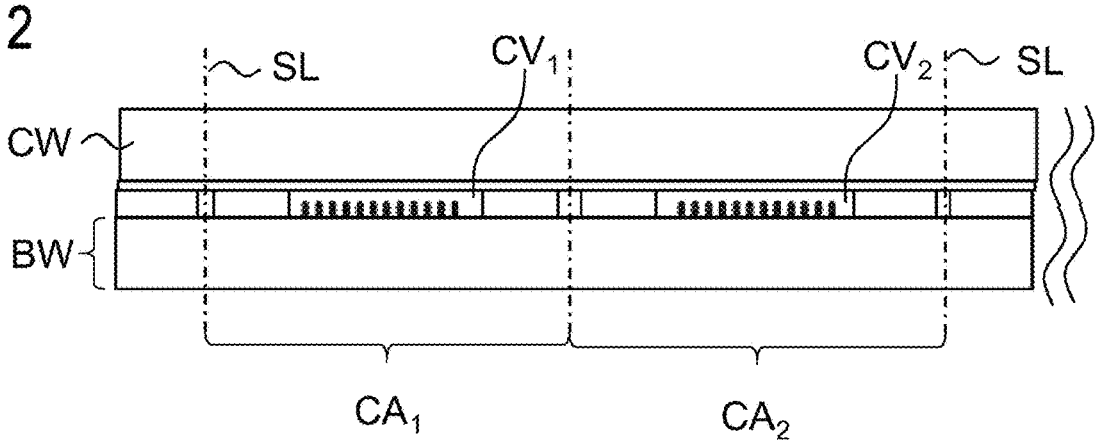
Figure 3:
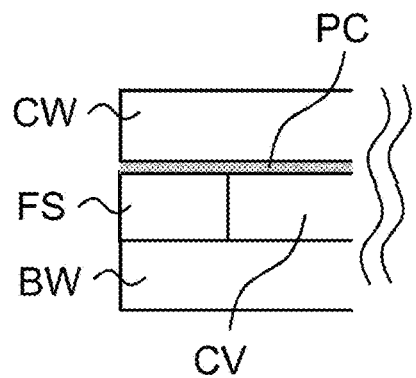
FIG. 3 is an enlarged cut-out at the edge of a later device to show the tight connection between frame structure FS and the cured polymer coating of the cap wafer CW.
Figure 4:
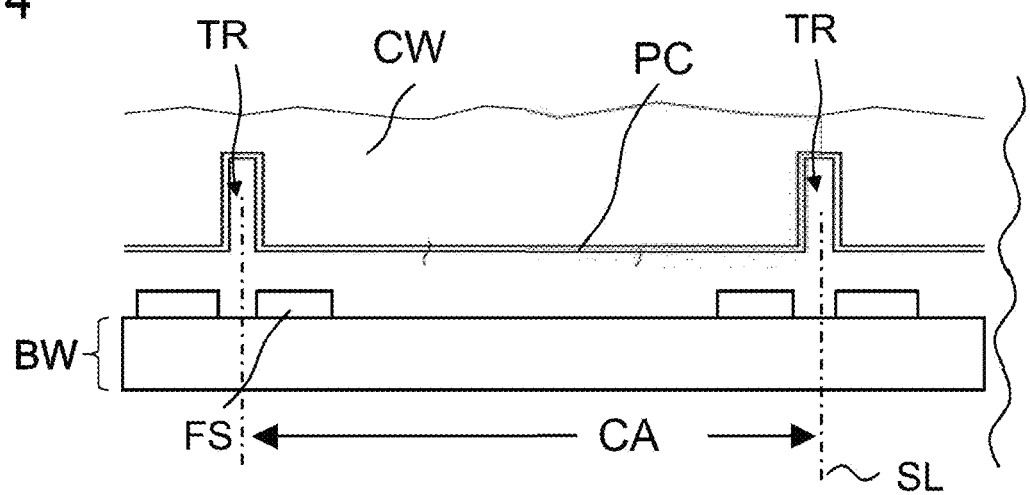
FIGS. 4 to 6 show in a cross sectional view different process steps of a half-cut dicing process that facilitates the later singulation of particular packaged devices.
Figure 5:
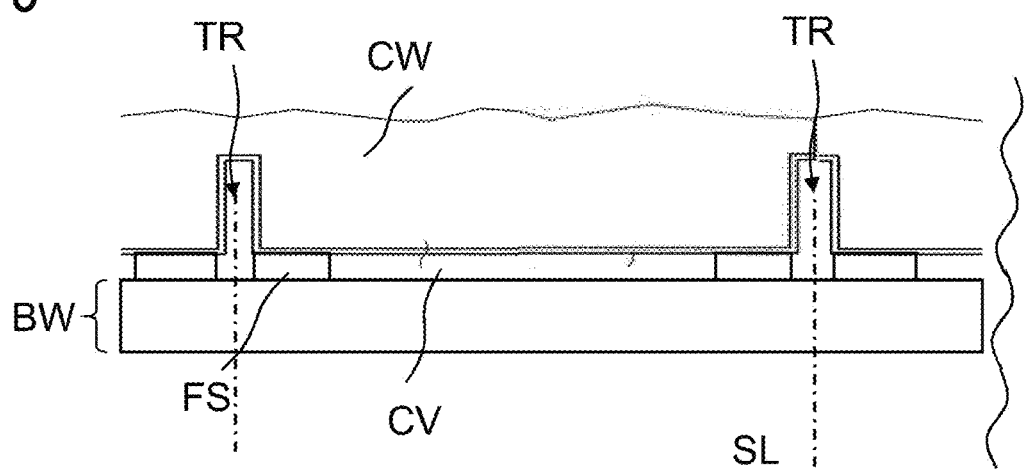
Figure 6:
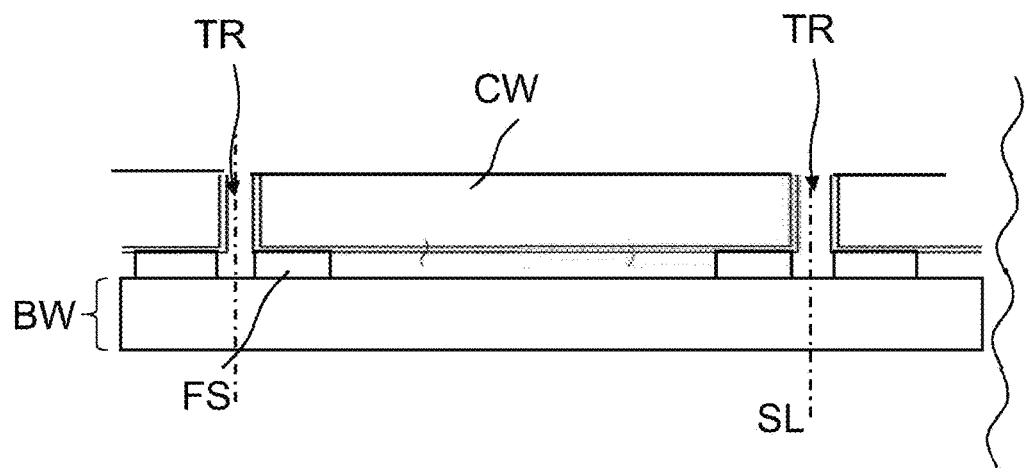

FIG. 4 to 6 show in a cross sectional view a base wafer BW having a top surface onto which a frame structure FS has been applied. The frame structure surrounds and encloses a device area DA on the surface of which electric structures for a micro acoustic device are formed (not shown in the figure). Each section of the frame structure FS may be assigned to one respective device area DA as shown. However it is also positive that a section of the frame structure FS separates two adjacent device areas and is hence common to both device areas. In those embodiments the later singulation of particular devices requires cutting through the frame structure such that the cavities of each device remain closed and tight.

In the bottom surface the cap wafer CW of a glass material that has to be bonded to the base wafer trenches TR are formed. These trenches comply with separation lines SL and are hence preforming the later device edge. Each trench is formed with a depth that is deeper than the later thickness of the cap where a cap is a section of the cap wafer CW that covers just one single device and closes one single cavity as a lid. A thin polymer coating PC of a UV curable polymer is applied to the entire bottom surface of the cap wafer CW and may extend to the sidewalls of the trench TR or may alternatively be applied to the bottom surface before forming the trench TR such that the sidewalls are free of polymer coating PC.

The cap wafer CW is then attached to the base wafer BW respectively to the frame structure FS on the top surface thereof. The entire arrangement is exposed to UV light for time sufficient to cure the polymer coating. By curing the polymer a tight and adhesive connection between frame structure and polymer forms.

In an embodiment a curing time of about 100 s is set. The process time is much shorter than the actual thermoscompression wafer bonding process that usually needs about 30 minutes.

After curing that is comparable with wafer bonding the cured polymer on the inner surface of the package/cavity offers an increased mechanical strength of the package by coating possible micro-cracks and precluding/minimizing subcritical crack growth. FIG. 5 shows the arrangement at this stage.

The so-formed wafer arrangement of the two wafers bonded together is subjected to a singulation process. In a first step thereof the cap wafer can be diced easily by grinding the top surface thereof until the bottom of the trenches is exposed. This can be done in a CMP (chemical mechanical polishing) process. FIG. 6 shows the arrangement at this stage. A further advantage of the thinning of the cap wafer the total height of the device is reduced. The final thickness of the cap is much thinner than the thickness of the cap wafer made of glass that is required to provide sufficient mechanical stability for secure handling of the cap wafer. When supported on the frame structures and after singulation the mechanical strength is high enough with the reduced final cap thickness of about 20 μm to 60 μm.

At the bottom of the now opened trenches TR the top surface of the base wafer BW is exposed between each two adjacent sections of the frame structures FS. Hence forming of contact pads from a metallization is possible at this (wafer level) stage. The contact pads KO of each later singulated micro-acoustic device are provided on the top surface of the cap/cap wafer.

According to an embodiment, an entire-surface base metallization is applied to the back of the cap wafer CW and the exposed surface of the base wafer BW. A structuring of the metallization follows that can be carried out with the help of an electroplating resist, which covers areas of the basic metallization that need not be reinforced. Thickening of the base metallization to the final layer thickness of the metallization is carried out by electroplating. Then the electroplating resist and the base metallization still existing in this area are removed, the latter by etching.

The formed metallization structure connects a pad of the device on the top surface of the base wafer BW to a contact pad KO on the top of the cap wafer CW. This contact pad KO is provided with a solderable top layer or a so-called under bump metallization.

This is followed by the selective application of bumps BU, for which the top layer of the metallization, which is for example a gold layer wetted with solder, is removed, except for those sections where the Bumps BU are to be applied. It is also possible to apply a resist that cannot be wetted with solder and structure it in such a way that openings are created in which the surface of the metallization that can be wetted with solder is exposed. The bumps BU themselves can be printed or electroplated. The bumps can also be applied as prefabricated balls and connected to the contacts by melting.

In the next step singulation of particular devices follows by dicing through the base wafer BW along the separation lines SL.

Figure 7:
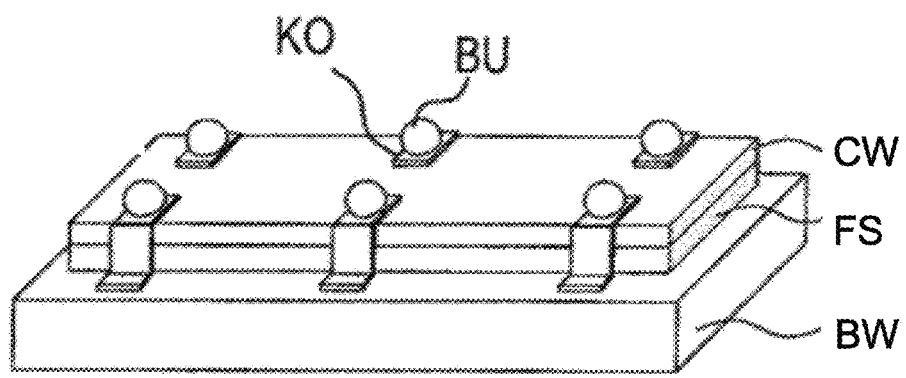

FIG. 7 shows an exemplary device in a perspective top view onto the cap. Six contact pads KO are provided for the device in the shown version, all of which are electrically conductively connected either to the electric structures ES on the top surface of the base wafer respectively the base substrate of the device after dicing. The number of contact pads KO equipped with bumps BU depends on the type of component. In the simplest case, two contact pads KO are sufficient to contact the micro-acoustic device encapsulated in the package. Especially for components working with acoustic waves, it is advantageous to provide a plurality of contacts for ground connections.

FIG. 7 shows a single micro-acoustic device in a package. This device can now be soldered to a final circuit by means of the bumps BU formed on the top surface of the cap wafer.

In alternative embodiments a contact to the electric structures of the devices is made by forming vias through the cap wafer (not shown). Similar to the trench-forming process these vias are preformed in an early step at the cap wafer before bonding it to the base wafer. The vias end up at the top surface of the cap and can also be covered with a contact pad and provided with bumps.

Though a number of variations of the process are possible all embodiments provide main advantages as follows:
1. A heterogeneous package solution for micro-acoustic devices like SAW filters on e.g. $LiTaO_3$ or $LiNbO_3$ with glass package is enabled
2. It is precluded that elements from the package material contaminate the cavity and hence the electric structures of the device
3. The mechanical strength of the glass package is increased
4. Compared to previous wafer-level packages only a very short processing time is required.

| List of used reference symbols | |
|---|---|
| BU | bump |
| BW | base wafer |
| CA | chip area |
| CV | cavity |
| CW | cap wafer |
| DA | device area |
| ES | electric structures |
| FS | frame structure |
| KO | contact pad |
| PC | polymer coating |
| PL | piezoelectric functional layer |
| SL | separation line |
| TR | trench |

The invention claimed is:

1. A micro-acoustic wafer-level package, comprising:
a base wafer (BW) with electric structures (ES) for micro-acoustic devices on a top surface thereof, each electric structure being assigned to a respective device area (DA);
a frame structure (FS) sitting on top of the base wafer enclosing each particular device area; and
a cap wafer (CW) bonded to the frame structure to form a closed cavity (CV) over each device area and to enclose within the cavity the device structures arranged on the respective device area;
wherein:
the base wafer comprises a piezoelectric functional layer;
the cap wafer comprises a glass material having a polymer coating (PC) on a bottom surface thereof, and wherein the glass material of the cap wafer comprises barium (Ba) as an additional element; and
the frame structure comprises a polymer.

2. The micro-acoustic wafer-level package of claim 1, wherein the polymer coating is formed from an UV-curable photoresist.

3. The micro-acoustic wafer-level package of claim 1, wherein the glass material of the cap wafer comprises additional elements chosen from first and second main group of the periodic system, to provide a coefficient of thermal expansion (CTE) that is matched to the CTE of the base wafer.

4. The micro-acoustic wafer-level package of claim 1, wherein the electric structures comprise a surface acoustic wave (SAW) transducer, wherein the base wafer is a piezoelectric wafer, and wherein the glass material of the cap wafer has a CTE that is matched to the CTE of the piezoelectric wafer.

5. The micro-acoustic wafer-level package of claim 1, wherein the base wafer comprises a carrier wafer, wherein the electric structures comprise a surface acoustic wave (SAW) transducer or a bulk acoustic wave (BAW) resonator realized within the piezoelectric functional layer, and wherein a coefficient of thermal expansion (CTE) of the cap wafer is adapted to the CTE of the carrier wafer.

6. The micro-acoustic wafer-level package of claim 1, wherein the base wafer comprises a wafer of LiTaO3 or LiNbO3.

7. The micro-acoustic wafer-level package of claim 1, wherein the base wafer comprises a wafer of LiTaO3 or LiNbO3.

8. The micro-acoustic wafer-level package of claim 1, wherein the micro-acoustic wafer-level package is used to singulate a micro-acoustic device, wherein each single device comprises exactly one cavity with respectively enclosed electric structures.

9. A method of forming a micro-acoustic wafer-level package, the method comprising:
providing a base wafer with an array of device areas on a top surface thereof assigned to a respective micro-acoustic device each forming a frame structure on the top surface that encloses each particular device area with respective electric structures;
providing a cap wafer having a coefficient of thermal expansion (CTE) adapted to the CTE of the base wafer and being provided with a UV-curable polymer coating on an underside thereof;
arranging the cap wafer on the frame structure in an arrangement; and
wafer-bonding the cap wafer with the polymer coating to the frame structure and curing the polymer coating by exposing the arrangement to UV light.

10. The method of claim 9, wherein wafer-bonding of the cap wafer with the polymer coating to the frame structure comprises applying UV light and uni-axial pressure at the same time to the arrangement.

11. The method of claim 9, wherein the cap wafer includes a glass material comprising additional elements chosen from first and second main group of the periodic system, to provide a CTE that is matched to the CTE of the base wafer.

12. The method of claim 9, wherein the electric structures comprise a SAW transducer, wherein the base wafer is a piezoelectric wafer, and wherein a glass material of the cap wafer has a CTE that is matched to the CTE of the piezoelectric wafer.

13. The method of claim 9, wherein the base wafer comprises a carrier wafer and a piezoelectric functional layer, wherein the electric structures comprise a SAW transducer or a BAW resonator realized within the piezoelectric functional layer, and wherein the CTE of the cap wafer is adapted to the CTE of the carrier wafer.

14. The method of claim 9, wherein the cap wafer includes a glass material comprising barium (Ba) as an additional element.

15. The method of claim 9, wherein the base wafer comprises a wafer of LiTaO3 or LiNbO3, wherein the base wafer comprises a wafer of LiTaO3 or LiNbO3.

16. A device, comprising:
a base wafer comprising a top surface, wherein the top surface comprises an array of device areas assigned to respective micro-acoustic devices, and wherein the respective micro-acoustic devices form a frame structure on the top surface that encloses corresponding device areas of the array of device areas with respective electric structures; and
a cap wafer having a coefficient of thermal expansion (CTE) adapted to a CTE of the base wafer, wherein the cap wafer has an underside coated with a UV-curable polymer coating, and wherein the cap wafer is wafer-bonded to the frame structure via the UV-curable polymer coating.

17. The device of claim 16, wherein the cap wafer includes a glass material comprising additional elements chosen from first and second main group of the periodic system, to provide a CTE that is matched to the CTE of the base wafer.

18. The device of claim 16, wherein the electric structures comprise a SAW transducer, wherein the base wafer is a piezoelectric wafer, and wherein a glass material of the cap wafer has a CTE that is matched to the CTE of the piezoelectric wafer.

19. The device of claim 16, wherein the base wafer comprises a carrier wafer and a piezoelectric functional layer, wherein the electric structures comprise a SAW transducer or a BAW resonator realized within the piezoelectric functional layer, and wherein the CTE of the cap wafer is adapted to the CTE of the carrier wafer.

20. A micro-acoustic wafer-level package, comprising:
a base wafer (BW) with electric structures (ES) for micro-acoustic devices on a top surface thereof, each electric structure being assigned to a respective device area (DA);
a frame structure (FS) sitting on top of the base wafer enclosing each particular device area; and
a cap wafer (CW) bonded to the frame structure to form a closed cavity (CV) over each device area and to enclose within the cavity the device structures arranged on the respective device area;
wherein:
the base wafer comprises a piezoelectric functional layer;
the cap wafer comprises a glass material having a polymer coating (PC) on a bottom surface thereof
the electric structures comprise a surface acoustic wave (SAW) transducer, wherein the base wafer is a piezoelectric wafer, and wherein the glass material of the cap wafer has a CTE that is matched to the CTE of the piezoelectric wafer; and
the frame structure comprises a polymer.

* * * * *